(12) United States Patent
Rouh et al.

(10) Patent No.: US 7,052,981 B2
(45) Date of Patent: May 30, 2006

(54) ION IMPLANTATION METHOD

(75) Inventors: Kyoung Bong Rouh, Kyoungki-do (KR); Seung Woo Jin, Kyoungki-do (KR); Bong Soo Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 37 days.

(21) Appl. No.: 10/880,017

(22) Filed: Jun. 29, 2004

(65) Prior Publication Data
US 2005/0059226 A1     Mar. 17, 2005

(30) Foreign Application Priority Data
Sep. 17, 2003   (KR) .................. 10-2003-0064358

(51) Int. Cl.
   *H01L 21/425* (2006.01)
(52) U.S. Cl. .................. 438/514; 438/480; 438/766
(58) Field of Classification Search ........ 438/514–515, 438/520, 527–528, 535, 550, 660, 798, 510, 438/517, 472–473, 480, 506, 766, 530–531
See application file for complete search history.

(56) References Cited

U.S. PATENT DOCUMENTS 4,253,888 A * 3/1981 Kikuchi .................. 438/514
6,869,865 B1 * 3/2005 Maegawa et al. ........... 438/514

* cited by examiner

*Primary Examiner*—Zandra V. Smith
*Assistant Examiner*—Thanh Y. Tran
(74) *Attorney, Agent, or Firm*—Ladas & Parry LLP

(57) ABSTRACT

Disclosed is an ion implantation method capable of preventing a channeling phenomenon caused by a lattice structure of a semiconductor substrate. The ion implantation method includes the steps of forming a predetermined mask pattern on the semiconductor substrate, performing an ion implantation process with respect to the semiconductor substrate exposed by the predetermined mask without forming a tilt angle, thereby forming an impurity area in the semiconductor substrate, and applying vibration to a lattice structure of the semiconductor substrate when the ion implantation process is carried out with respect to the semiconductor substrate.

15 Claims, 3 Drawing Sheets

ION IMPLANTATION METHOD

BACKGROUND OF THE INVENTION

1. Field of the Invention

The present invention relates to an ion implantation method, and more particularly to an ion implantation method capable of preventing a channeling phenomenon caused by a lattice structure of a semiconductor substrate.

2. Description of the Prior Art

Recently, when fabricating semiconductor devices, an ion implantation method is widely used for forming impurity areas in a substrate, such as a deep well, a source region and a drain region of a field effect transistor, a channel area, and an anti-punch through area. This is because the ion implantation method can form an impurity area having a desired doping profile while finely adjusting the impurity area as compared with a diffusion method.

FIG. 1 is a view for explaining a conventional ion implantation method without a tilt angle. As shown in FIG. 1, after forming a photoresist pattern 12 on an upper surface of a semiconductor substrate 10, an ion implantation is carried out without the tilt angle by using the photoresist pattern 12 as a mask such that a predetermined impurity layer is formed, that is, the ion implantation is carried out in a state in which the tilt angle is zero.

Generally, the semiconductor substrate 10 is made from single crystalline silicon material. In this case, the semiconductor substrate 10 has a lattice structure in which silicon atoms 10a are uniformly aligned.

However, according to the convention ion implantation method without the tilt angle, an implanted ion 10b may not make contact with silicon atoms 10a of the lattice structure, but pass through gaps formed between silicon atoms 10a, called a "channeling phenomenon", so it is difficult to form an impurity layer having a desired profile.

To solve the above problem caused by the channeling phenomenon, an ion implantation method utilizing a tilt angle and a twist angle when implanting ions has been proposed.

FIG. 2 is a view showing a conventional ion implantation method adopting a tilt angle when implanting ions. Referring to FIG. 2, after forming a photoresist pattern 22 on an upper surface of a semiconductor substrate 20, an ion implantation is carried out with a predetermined tilt angle by using the photoresist pattern 22 as a mask such that a predetermined impurity layer is formed on the semiconductor substrate 20.

Generally, the semiconductor substrate 20 is made from single crystalline silicon material. In this case, the semiconductor substrate 20 has a lattice structure in which silicon atoms 20a are uniformly aligned.

According to the conventional ion implantation method adopting the tilt angle, implanted ions 20b may frequently make contact with silicon atoms 20a, thereby preventing the channeling phenomenon. However, due to a step difference between an ion implantation angle and the photoresist pattern 22 of the semiconductor substrate 20, ions may not be implanted into a predetermined area of the semiconductor substrate 20, which is called a "shadowing effect". In addition, ions scattered from the photoresist pattern 22 is implanted into a predetermined area of the semiconductor substrate 20, thereby distorting a doping profile of an impurity area, which is called a "scattering effect".

Recently, as a size of a semiconductor device becomes reduced, the shadowing effect and the scattering effect may cause an asymmetric doping profile of the impurity area. As a result, electrical characteristics of peripheral circuits, such as a sense amp, are deteriorated.

SUMMARY OF THE INVENTION

Accordingly, the present invention has been made to solve the above-mentioned problems occurring in the prior art, and an object of the present invention is to provide an ion implantation method, in which a lattice structure of a semiconductor substrate is vibrated so that ion-collision and scattering frequencies are increased when ions are implanted without a tilt angle, thereby preventing a channeling phenomenon.

In order to accomplish the object, according to a first aspect of the present invention, there is provided an ion implantation method for forming an impurity area in a semiconductor substrate by implanting ions into the semiconductor substrate, the ion implantation method comprising the steps of: forming a predetermined mask pattern on the semiconductor substrate; performing an ion implantation process with respect to the semiconductor substrate exposed by the predetermined mask without forming a tilt angle, thereby forming the impurity area in the semiconductor substrate; and applying vibration to a lattice structure of the semiconductor substrate when the ion implantation process is carried out with respect to the semiconductor substrate.

According to a second aspect of the present invention, there is provided an ion implantation method for forming an impurity area in a semiconductor substrate by implanting ions into the semiconductor substrate, the ion implantation method comprising the steps of: forming a predetermined mask pattern on the semiconductor substrate; implanting inert gas into the semiconductor substrate exposed by the predetermined mask pattern; performing an ion implantation process with respect to the semiconductor substrate exposed by the predetermined mask without forming a tilt angle, thereby forming the impurity area in the semiconductor substrate; and applying vibration to a lattice structure of the semiconductor substrate when the ion implantation process is carried out with respect to the semiconductor substrate.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
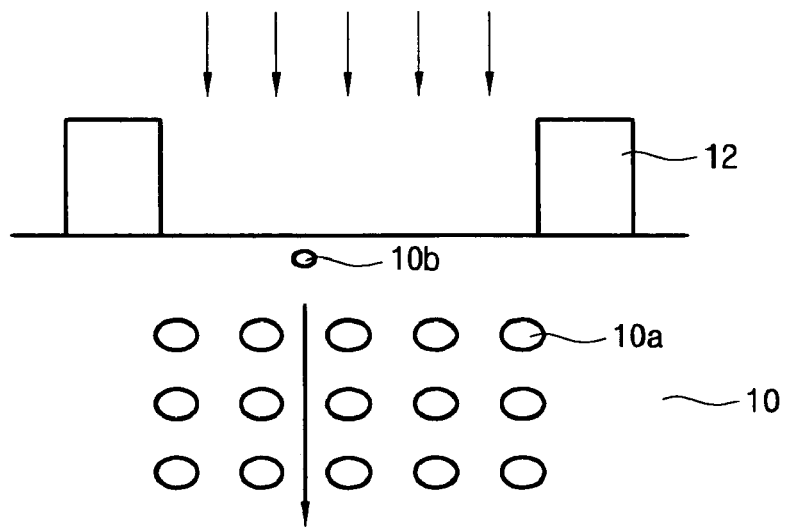
FIG. 1 is a view for explaining a conventional ion implantation method without a tilt angle.
Figure 2:
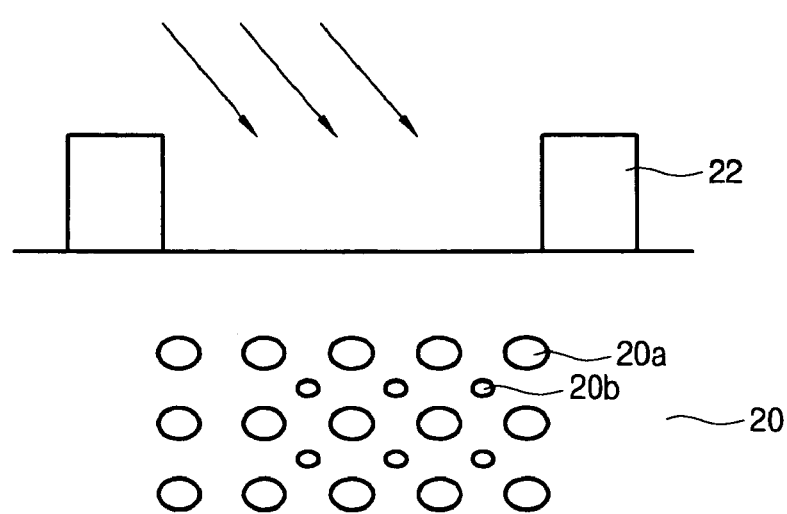
FIG. 2 is a view for explaining a conventional ion implantation method adopting a tilt angle.

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 3:
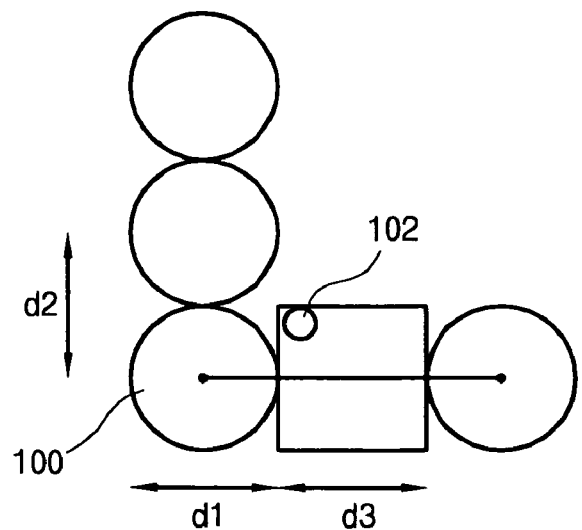
FIGS. 3 and 4 are views for explaining a principle of an ion implantation method according to one embodiment of the present invention.
Figure 4:
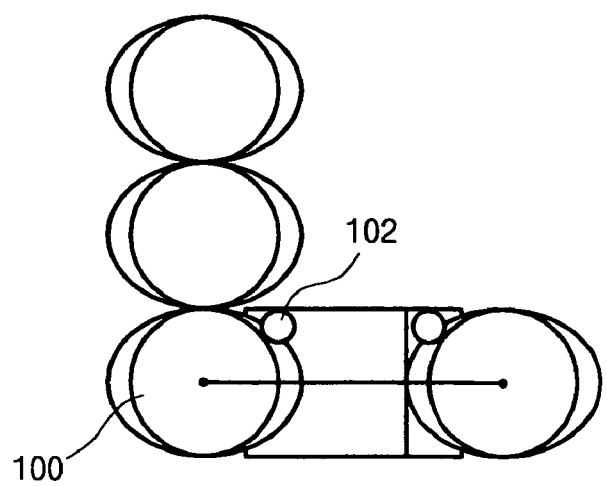

FIGS. 3 and 4 are views for explaining a principle of an ion implantation method according to one embodiment of the present invention. In detail, FIG. 3 is a view showing a silicon lattice structure and FIG. 4 is a view showing a vibration state of the silicon lattice structure. Herein, the same reference numerals are used to refer the same elements.

Referring to FIG. 3, in a semiconductor substrate having a general silicon lattice structure, a diameter d1 of a silicon atom 100 is 2.36 Å, a distance d2 between centers of two silicon atoms is 2.35 Å, a distance d3 between silicon lattices is 3.07 Å, and a diameter of a smallest boron ion 102 to be implanted is 0.46 Å.

Herein, on the assumption that vibration or scattering is not applied to the normal silicon lattice structure, the number of implanted boron ions capable of simultaneously passing through between the lattices of the semiconductor substrate is corresponding to 6.67×6.67=44.48.

However, as shown in FIG. 4, if vibration is applied to the silicon lattice structure caused by external impact, such as a heat source, a light source or a physical pulse, the distance between the lattices is three-dimensionally changed.

Accordingly, an amount of implanted boron ions capable of simultaneously passing through between the lattices is frequently varied. That is, linearly moved boron ions may frequently make contact with three-dimensionally vibrated silicon atoms, so the channeling effect of the implanted boron ions can be reduced.

Figure 5:
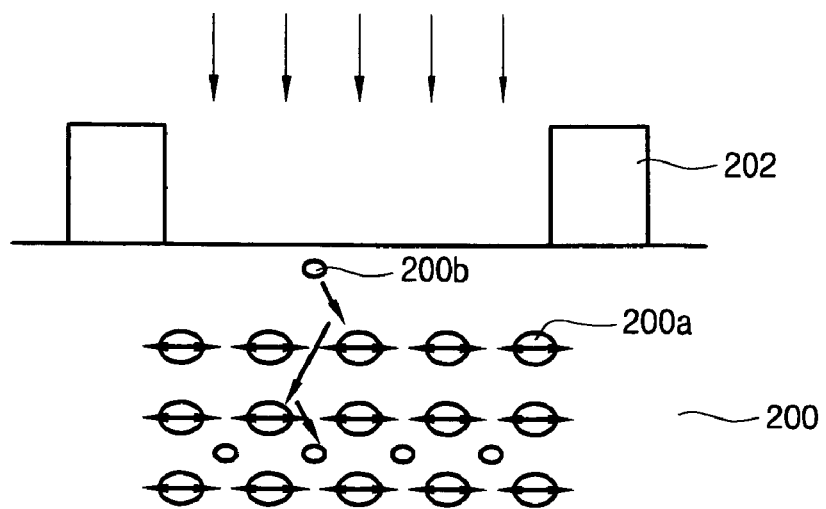
FIG. 5 is a view for explaining an ion implantation method according to one embodiment of the present invention.

FIG. 5 is a view for explaining an ion implantation method according to one embodiment of the present invention.

Referring to FIG. 5, after coating a photoresist film on a semiconductor substrate 200, the photoresist film is patterned, thereby forming a predetermined mask pattern 202. Then, an ion implantation process is carried out with respect to an entire surface of the semiconductor substrate 200 exposed by the mask pattern 202 without forming a tilt angle, that is, with a tilt angle zero, thereby forming an impurity area in the semiconductor substrate 200. At this time, vibration is applied to the semiconductor substrate 200 having a uniform silicon lattice structure by applying external impact to the semiconductor substrate 200.

According to one embodiment of the present invention, one of a heat source, a light source and a physical pulse is selectively applied to the semiconductor substrate 200 as external impact or all of the heat source, light source and physical pulse are simultaneously applied to the semiconductor substrate 200.

Preferably, the heat source has a temperature less than 210° C., the light source has a wavelength less than 0.75 µm and more than 10 nm, and the physical pulse is created by means of mega band or ultra band ultrasonic waves.

In addition, the light source or the physical pulse is preferably applied to a front surface of a rear surface of the semiconductor substrate.

According to one embodiment of the present invention, when the physical pulse is applied to the semiconductor substrate in order to vibrate the semiconductor substrate, amplitude of vibration can be adjusted by varying a frequency of the physical pulse.

Therefore, according to one embodiment of the present invention, the amplitude of vibration can be adjusted by adjusting external impact applied to the semiconductor substrate when the ion implantation is carried out, so that ions 200b implanted into the semiconductor substrate 200 can be frequently scattered while frequently colliding with silicon atoms 200a.

Figure 6:
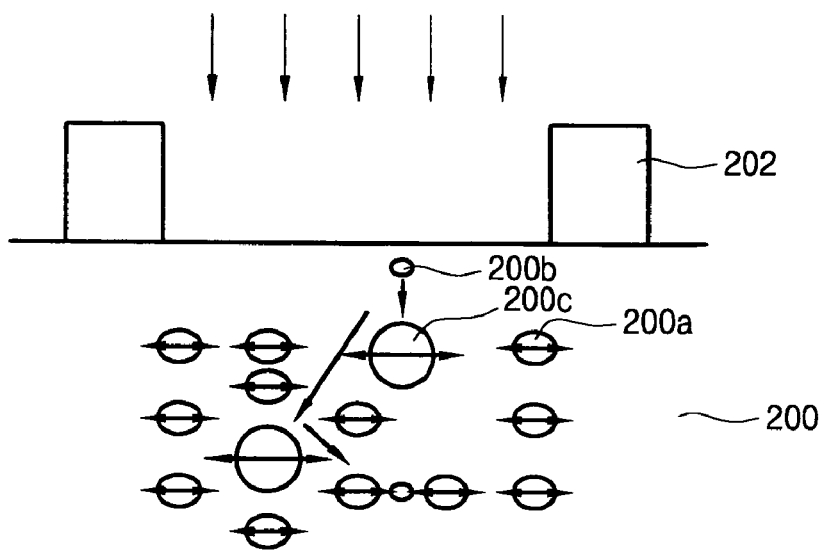
FIG. 6 is a view for explaining an ion implantation method according to another embodiment of the present invention.

FIG. 6 is a view for explaining an ion implantation method according to another embodiment of the present invention. In FIG. 6, the same reference numerals are used to designate the same or similar components of FIG. 5.

According to the ion implantation method of the present embodiment, one of inert gases 200c, such as He, Ne, Ar, Xe or Rn, having a particle size larger that that of an implanted ion is selectively implanted into the semiconductor substrate 200 prior to the ion implantation process. Thus, when the ion implantation process is carried out, ions 200b implanted into the semiconductor substrate 200 make contact with silicon atoms 200a, thereby increasing the scattering frequency of the ions. Other process steps are identical to those of the first embodiment, so detailed description thereof will be omitted below.

As described above, according to the present invention, ions are implanted into the semiconductor substrate without forming a tilt angle while vibrating the lattice structure of the semiconductor substrate, thereby increasing ion-collision and ion scattering frequencies. Thus, the channeling phenomenon can be prevented without forming an asymmetric doping profile. As a result, electrical characteristics of peripheral circuits can be improved.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. An ion implantation method for forming an impurity area in a semiconductor substrate by implanting ions into the semiconductor substrate, the ion implantation method comprising the steps of:
   i) forming a predetermined mask pattern on the semiconductor substrate;
   ii) performing an ion implantation process with respect to the semiconductor substrate exposed by the predetermined mask without forming a tilt angle, thereby forming the impurity area in the semiconductor substrate; and
   iii) applying vibration to a lattice structure of the semiconductor substrate when the ion implantation process is carried out with respect to the semiconductor substrate.

2. The ion implantation method as claimed in claim 1, wherein the vibration is created by selectively applying one of a heat source, a light source and a physical pulse to the semiconductor substrate or simultaneously applying all of the heat source, light source and physical pulse to the semiconductor substrate.

3. The ion implantation method as claimed in claim 2, wherein the heat source has a temperature less than 210° C.

4. The ion implantation method as claimed in claim 2, wherein the light source has a wavelength less than 0.75 µm and more than 10 nm.

5. The ion implantation method as claimed in claim 2, wherein the physical pulse is created by means of mega band or ultra band ultrasonic waves.

6. The ion implantation method as claimed in claim 2, wherein the light source and the physical pulse are applied to a front surface or a rear surface of the semiconductor substrate.

7. The ion implantation method as claimed in claim 2, wherein amplitude of the vibration is adjustable by varying frequencies of the physical pulse.

8. An ion implantation method for forming an impurity area in a semiconductor substrate by implanting ions into the semiconductor substrate, the ion implantation method comprising the steps of:
   i) forming a predetermined mask pattern on the semiconductor substrate;
   ii) implanting inert gas into the semiconductor substrate exposed by the predetermined mask pattern;
   ii) performing an ion implantation process with respect to the semiconductor substrate exposed by the predetermined mask without forming a tilt angle, thereby forming the impurity area in the semiconductor substrate; and
   iv) applying vibration to a lattice structure of the semiconductor substrate when the ion implantation process is carried out with respect to the semiconductor substrate.

9. The ion implantation method as claimed in claim 8, wherein the inert gas includes one selected from the group consisting of He, Ne, Ar, Xe and Rn.

10. The ion implantation method as claimed in claim 8, wherein the vibration is created by selectively applying one of a heat source, a light source and a physical pulse to the semiconductor substrate or simultaneously applying all of the heat source, light source and physical pulse to the semiconductor substrate.

11. The ion implantation method as claimed in claim 10, wherein the light source has a wavelength less than 0.75 μm and more than 10 nm.

12. The ion implantation method as claimed in claim 10, wherein the heat source has a temperature less than 210° C.

13. The ion implantation method as claimed in claim 10, wherein the physical pulse is created by means of mega band or ultra band ultrasonic waves.

14. The ion implantation method as claimed in claim 10, wherein the light source and the physical pulse are applied to a front surface or a rear surface of the semiconductor substrate.

15. The ion implantation method as claimed in claim 10, wherein amplitude of the vibration is adjustable by varying frequencies of the physical pulse.

* * * * *